(12) United States Patent
Mo

(10) Patent No.: US 9,060,426 B2
(45) Date of Patent: Jun. 16, 2015

(54) SECURING MECHANISM

(71) Applicant: Wistron Corporation, New Taipei (TW)

(72) Inventor: Han-Jun Mo, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/231,369

(22) Filed: Mar. 31, 2014

(65) Prior Publication Data

US 2015/0137673 A1  May 21, 2015

(30) Foreign Application Priority Data

Nov. 15, 2013 (CN) ....................... 2013 2 0725394 U

(51) Int. Cl.
*H05K 7/00* (2006.01)
*G06F 1/16* (2006.01)
*H05K 5/00* (2006.01)
*H05K 5/02* (2006.01)

(52) U.S. Cl.
CPC .................................... *H05K 5/0221* (2013.01)

(58) Field of Classification Search
CPC ......... G06F 1/187; G06F 1/184; G06F 1/181; G06F 1/1656; G06F 1/185; G06F 1/186; G11B 33/124; G11B 33/128
See application file for complete search history.

(56) References Cited

U.S. PATENT DOCUMENTS

| | | | |
|---|---|---|---|
| 6,188,571 B1 * | 2/2001 | Roganti et al. | 361/679.33 |
| 6,343,009 B1 * | 1/2002 | Liu et al. | 361/679.31 |
| 6,728,109 B1 * | 4/2004 | Wu | 361/747 |
| 7,443,667 B2 * | 10/2008 | Guo et al. | 361/679.33 |
| 7,495,908 B2 * | 2/2009 | Zhang et al. | 361/679.33 |
| 7,611,100 B2 * | 11/2009 | Peng et al. | 248/27.1 |
| 8,369,077 B2 * | 2/2013 | Peng et al. | 361/679.33 |
| 8,472,180 B2 * | 6/2013 | Gong et al. | 361/679.33 |
| 8,582,300 B2 * | 11/2013 | Liang et al. | 361/724 |
| 2005/0099767 A1 * | 5/2005 | Wu | 361/685 |
| 2005/0128919 A1 * | 6/2005 | Huang et al. | 369/75.11 |
| 2005/0135051 A1 * | 6/2005 | Chen et al. | 361/683 |
| 2005/0280982 A1 * | 12/2005 | Yang | 361/684 |
| 2006/0164803 A1 * | 7/2006 | Chen et al. | 361/685 |
| 2007/0268662 A1 * | 11/2007 | Zhang et al. | 361/685 |
| 2008/0130219 A1 * | 6/2008 | Rabinovitz | 361/685 |
| 2014/0022723 A1 * | 1/2014 | Yang et al. | 361/679.37 |

* cited by examiner

*Primary Examiner* — Hoa C Nguyen
*Assistant Examiner* — Xanthia C Cunningham
(74) *Attorney, Agent, or Firm* — The Mueller Law Office, P.C.

(57) ABSTRACT

A securing mechanism includes a rail unit and a locking unit. The rail unit has a first rail structure, a guiding surface that is formed with a pin extension slot, and a first engaging structure. The locking unit has a fixing pin protruding into the pin extension slot, a second rail structure cooperating with the first rail structure to move the locking unit between an unlocked position, where the fixing pin is away from a fixing hole of the electronic device and where the first engaging structure is separated from the second engaging structure, and a locked position, where the fixing pin engages the fixing hole of the electronic device and where the second engaging structure engages the first engaging structure for fixing the electronic device to a mounting frame.

9 Claims, 15 Drawing Sheets

SECURING MECHANISM

CROSS-REFERENCE TO RELATED APPLICATION

This application claims priority of Chinese Patent Application No. 201320725394.8, filed on Nov. 15, 2013, the disclosure of which is incorporated herein by reference.

BACKGROUND OF THE INVENTION

1. Field of the Invention

This invention relates to a securing mechanism, more particularly to a securing mechanism that is capable of securing an electronic device.

2. Description of the Related Art

Conventionally, when an electronic device (e.g., an optical disc drive) needs to be mounted to a server or a personal computer, a securing member (e.g., a screw) is often used so as to lock the electronic device to a mounting frame of the server or the personal computer. When applying the screw in the locking process, a tool (e.g., a screwdriver) is required. Therefore, mounting and dismounting processes of the electronic device are not only inconvenient but also time-consuming. As a result, a tool-less securing mechanism has been developed to improve the efficiency of mounting and dismounting an electronic device.

A conventional tool-less securing mechanism is usually secured to a mounting frame of a server, and has a securing portion that engages separably a securing structure of an electronic device and a press portion for a user to press so as to disengage the securing portion from the electronic device. When mounting the electronic device, the user first uses one hand to press the press portion so as to move the securing portion out of the passageway of the electronic device, then uses the other hand to insert the electronic device into the mounting frame, and finally releases the press portion such that the securing portion restores to a normal position and engages the securing structure of the electronic device, thereby positioning the electronic device. When dismounting the electronic device, the user must use one hand to press the press portion to separate the securing portion from the securing structure of the electronic device, and use the other hand to enter the mounting frame and pull out the electronic device.

However, during the mounting or the dismounting process of the electronic device with the above-mentioned conventional tool-less securing mechanism, the user must use both hands to respectively operate the securing mechanism and the electronic device, which is relatively inconvenient. Moreover, the user must use one hand to enter the mounting frame so as to grab the electronic device for removal from the mounting frame. For a server that has a complex internal structure, it is even more difficult to locate the electronic device and to perform the operation within the constraints of the mounting frame. In addition, the conventional securing mechanism generally does not fit with a variety of electronic devices of different sizes. Therefore, there is still room for improvement.

SUMMARY OF THE INVENTION

Therefore, an object of the present invention is to provide a securing mechanism that can facilitate mounting and dismounting of an electronic device with only one hand.

Another object of the present invention is to provide a securing mechanism which, when being operated to remove the electronic device from a mounting frame, does not require a user's hand to enter the mounting frame for grabbing the electronic device.

Another object of the present invention is to provide a securing mechanism that facilitates efficient mounting and dismounting of the electronic device.

Another object of the present invention is to provide a securing mechanism that fits with a variety of electronic devices of different sizes.

Accordingly, a securing mechanism of the present invention is adapted for fixing at least one electronic device to a mounting frame. The mounting frame defines an accommodating space, and has a lateral plate and an opening that communicates the accommodating space. The electronic device is able to be inserted into or pulled out from the accommodating space through the opening in an insertion direction that is parallel to the lateral plate, and is formed with at least one fixing hole that faces the lateral plate. The securing mechanism includes at least one rail unit and at least one locking unit.

The rail unit has a first rail structure, a guiding surface, a through hole and a first engaging structure. The first rail structure is adapted to be fixed on the lateral plate. The guiding surface is adapted to be formed at an outer end of the lateral plate, has a flat surface portion and an inclined surface portion arranged in the insertion direction, and is formed with at least one pin extension slot extending substantially in the insertion direction. The flat surface portion is parallel to the lateral plate. The inclined surface portion extends from the flat surface portion toward the opening and is inclined outwardly from the lateral plate. The through hole extends through the lateral plate to communicate the accommodating space, and is farther from the opening than the guiding surface. The first engaging structure is adapted to be fixed on the lateral plate.

The locking unit is mounted to the rail unit, and has a main body, a second rail structure that is fixed on the main body, a first flexible portion that extends from the main body toward the opening, and a second flexible portion that extends from the main body. The main body has a main portion and a deformable portion that are arranged in the insertion direction, and at least one fixing pin that protrudes from the deformable portion into the pin extension slot. The deformable portion extends from the main portion toward the opening and abuts against the guiding surface.

The second rail structure cooperates with the first rail structure such that the locking unit is slidable in the insertion direction between an unlocked position which is proximate to the opening, and a locked position which is distal from the opening. The first flexible portion is bent into the accommodating space, is elastically deformable relative to the main body, and has a first slope that faces away from the opening. The second flexible portion is elastically deformable relative to the main body, and has a second engaging structure that is engageable removably the first engaging structure.

When the locking unit is at the unlocked position, the first flexible portion extends into the accommodating space through the through hole, the deformable portion is pushed by the inclined surface portion of the guiding surface to deform so as to move the fixing pin away from the accommodating space, and the first engaging structure and the second engaging structure are separated from each other. When the electronic device is inserted into the accommodating space, the first flexible portion is pushed by the electronic device to result in movement of the locking unit to the locked position, where the first slope is pushed by the lateral plate such that the first flexible portion deforms and leaves the accommodating space, where the deformable portion of the main body is separated from the inclined surface portion and restores to drive the fixing pin to engage the fixing hole of the electronic device, and where the second engaging structure engages the first engaging structure.

BRIEF DESCRIPTION OF THE DRAWINGS

Other features and advantages of the present invention will become apparent in the following detailed description of the embodiment of this invention, with reference to the accompanying drawings, in which.

DETAILED DESCRIPTION OF THE EMBODIMENT

Figure 1:
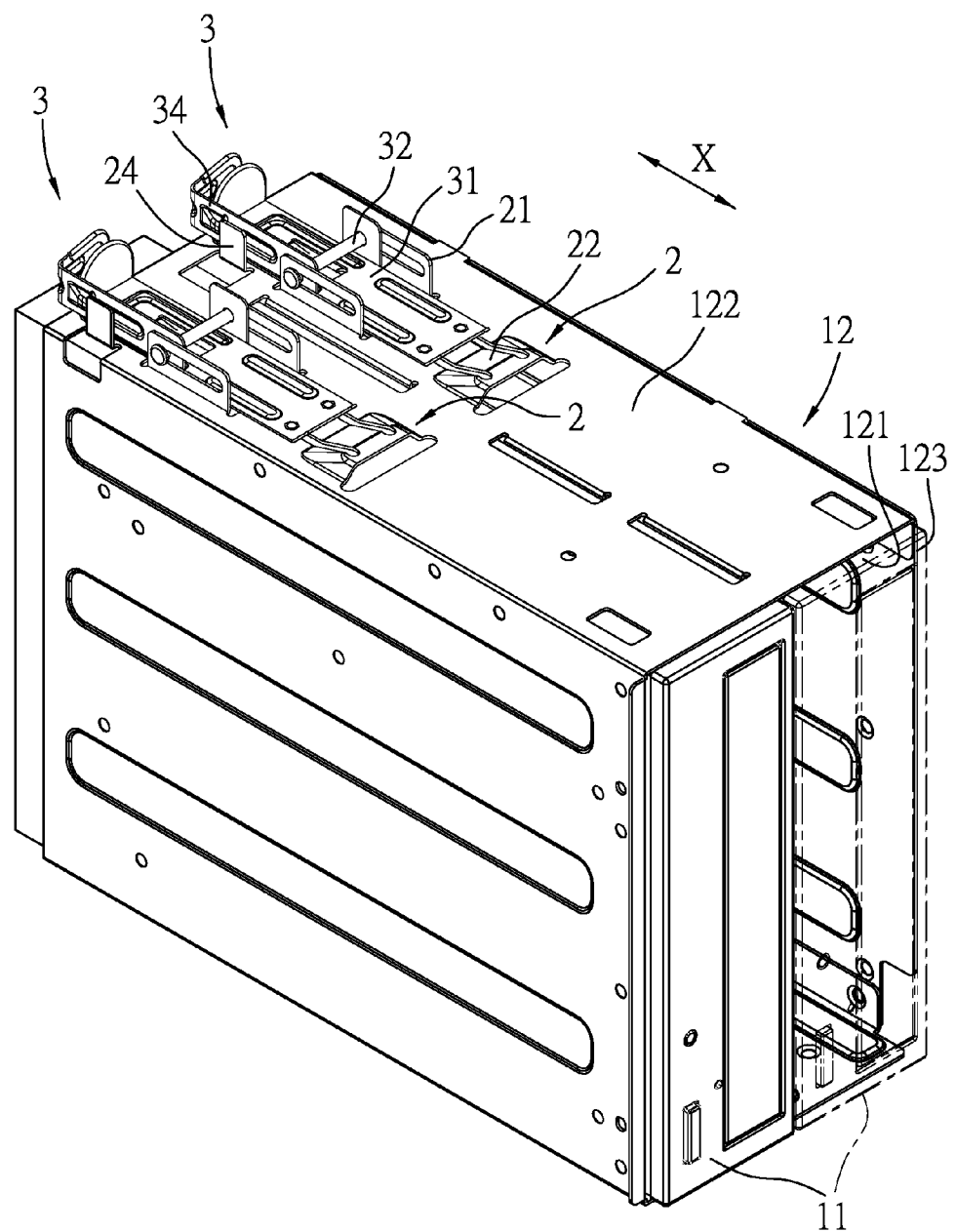
FIG. 1 is a perspective view of the embodiment of a securing mechanism according to this invention that secures an electronic device in a mounting frame.

FIG. 1 shows an embodiment of a securing mechanism according to the present invention. The securing mechanism is adapted for fixing two electronic devices 11 to a mounting frame 12. The mounting frame 12 defines an accommodating space 121, and has a lateral plate 122 and an opening 123 that communicates the accommodating space 121. Each of the electronic devices 11 is able to be inserted into or pulled out from the accommodating space 121 through the opening 123 in an insertion direction (X) that is parallel to the lateral plate 122, and is formed with two fixing holes 111 that face the lateral plate 122 (see FIG. 6). In this embodiment, the electronic device 11 is an optical disc drive (ODD), but the configuration of the electronic device 11 is not limited thereto. The securing mechanism includes two rail units 2 that are parallel to each other and that are spaced apart from each other in a first direction perpendicular to the insertion direction (X), and two locking units 3 that are respectively mounted to the rail units 2. Since the rail units 2 are identical to each other in structure and the locking units 3 are also identical to each other in structure, for the sake of brevity, only one rail unit 2 and one locking unit 3 will be described in the following description.

Figure 2:
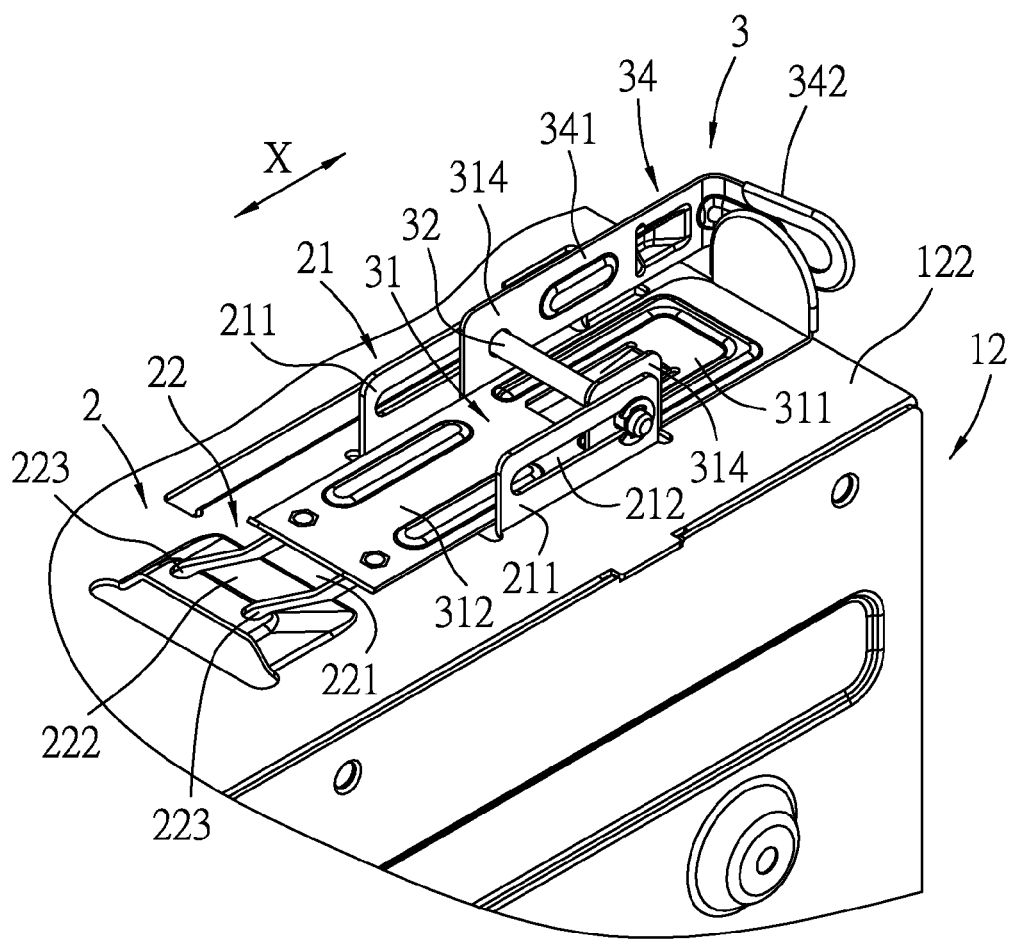
FIG. 2 is a fragmentary perspective view showing the mounting frame and the securing mechanism.
Figure 3:
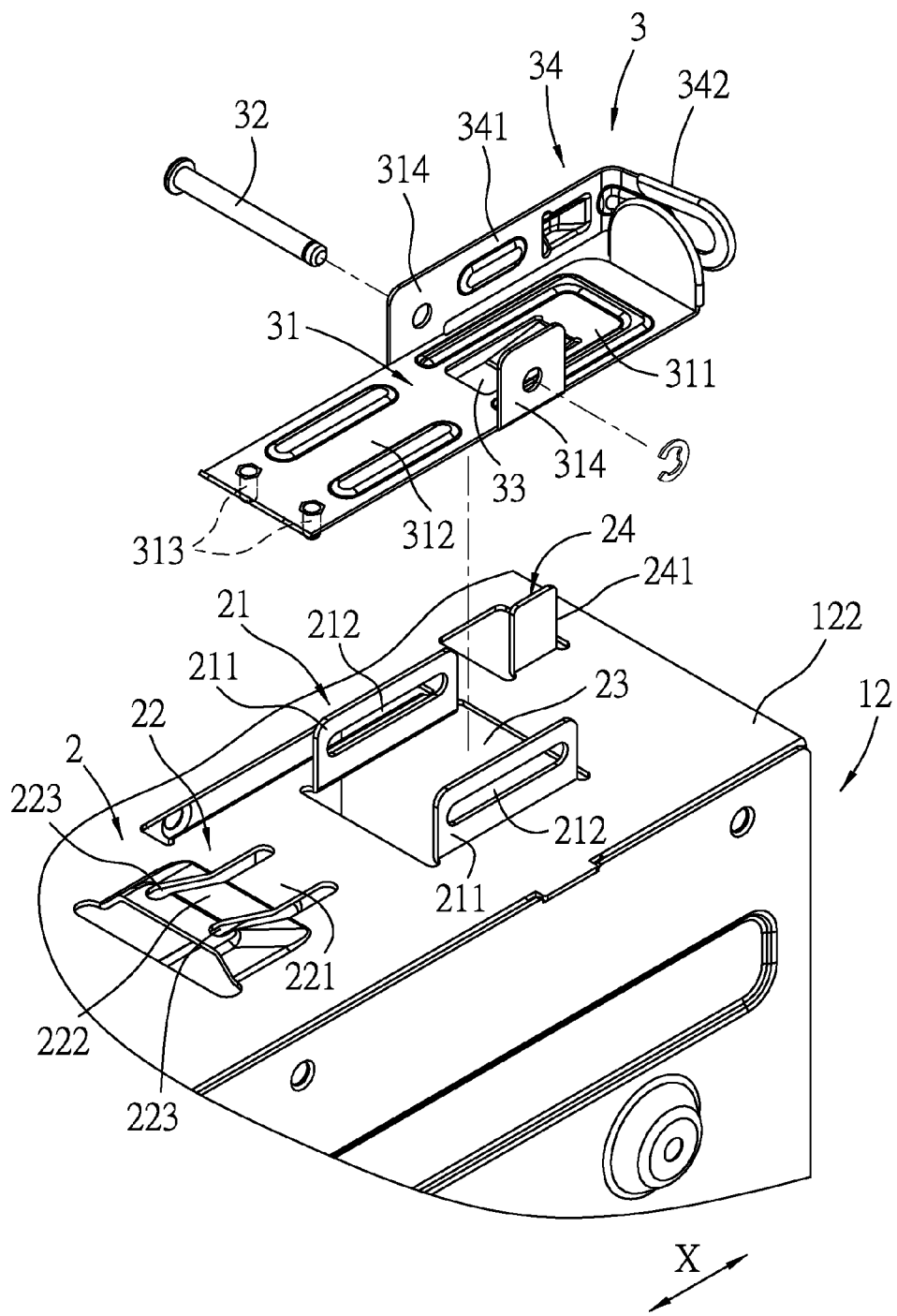
FIG. 3 is a fragmentary exploded perspective view showing the mounting frame and the securing mechanism.
Figure 4:
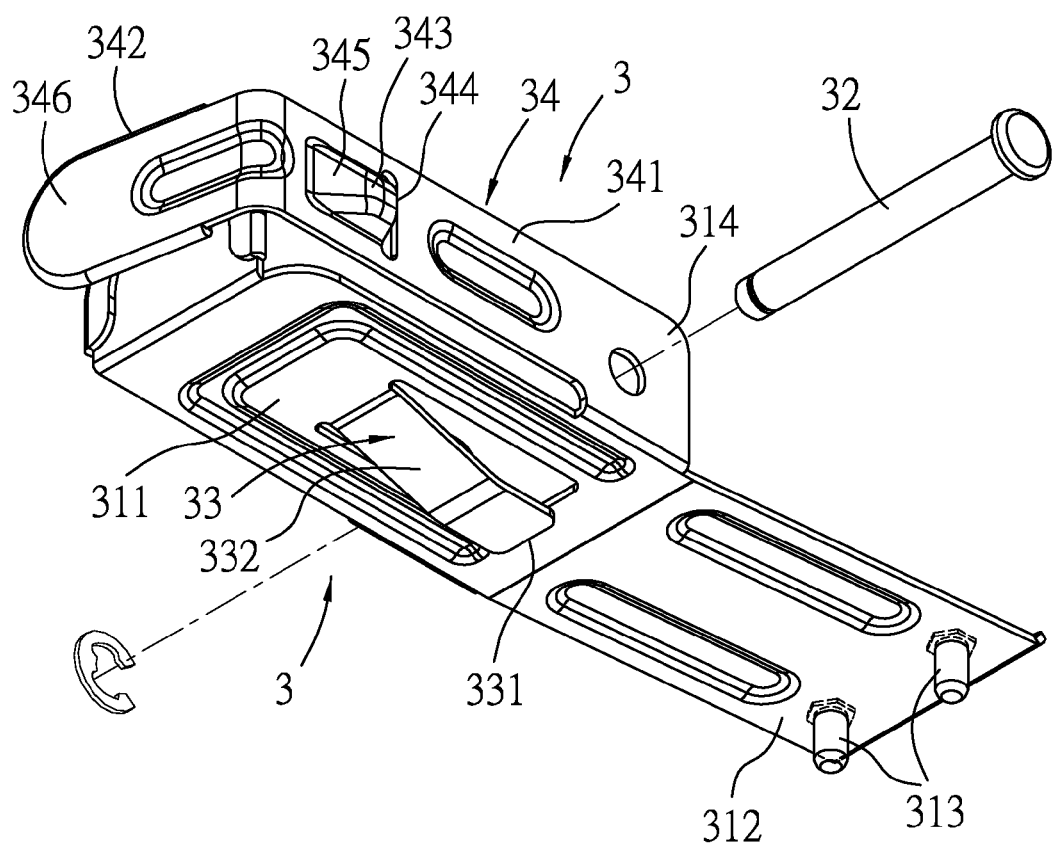
FIG. 4 is an exploded perspective view showing the securing mechanism.
Figure 5:
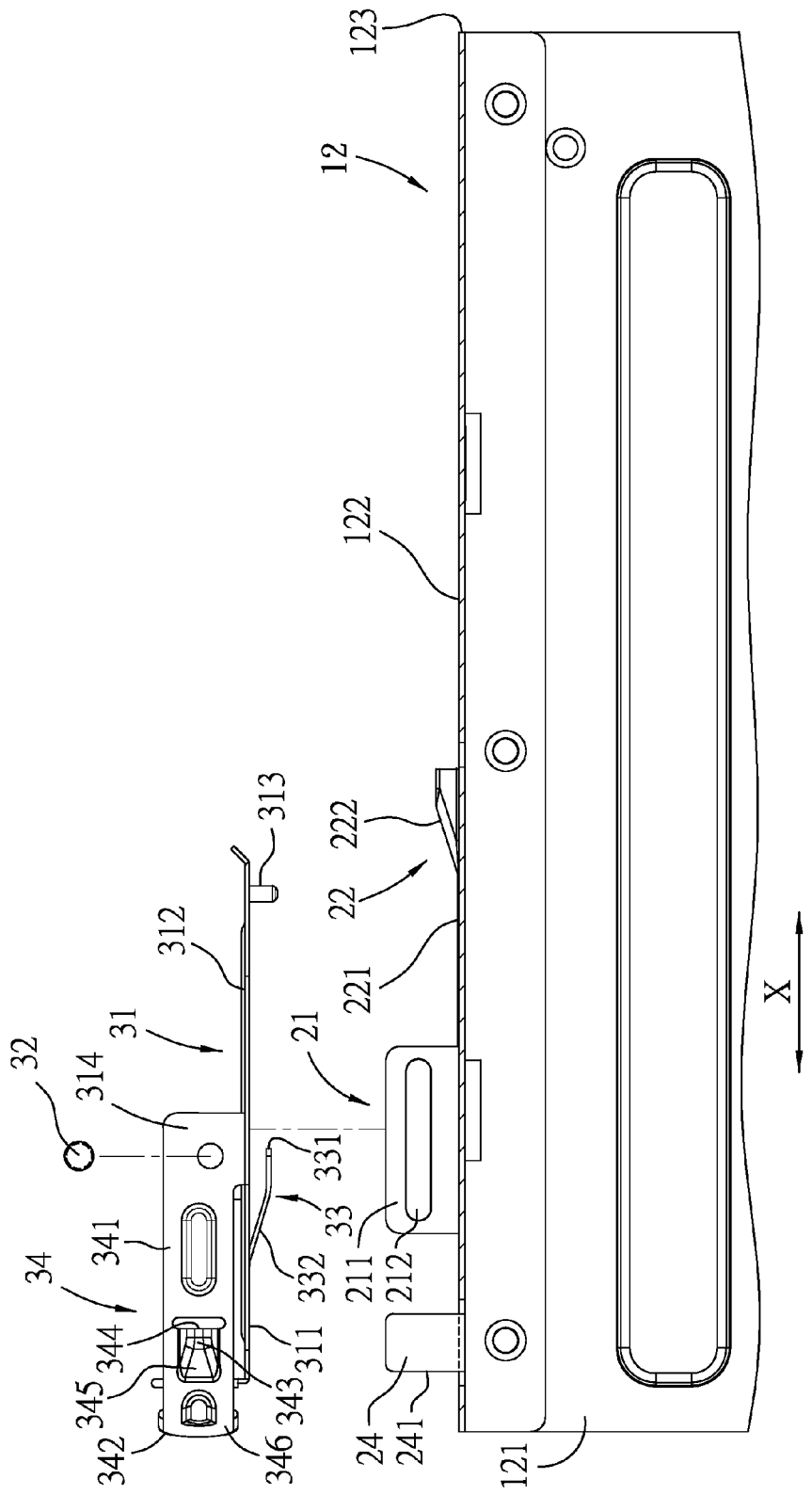
FIG. 5 is a fragmentary exploded partly sectional view showing the mounting frame and the securing mechanism.

Referring to FIG. 2, FIG. 3 and FIG. 5, the rail unit 2 has a first rail structure 21 that is adapted to be fixed on the lateral plate 122, a guiding surface 22 that is adapted to be formed at an outer end of the lateral plate 122, a through hole 23 that extends through the lateral plate 122 to communicate the accommodating space 121, and a first engaging structure 24 that is adapted to be fixed on the lateral plate 122. The first rail structure 21 extends in the insertion direction (X), and has two limiting plates 211 that protrude outwardly and perpendicularly from the lateral plate 122. The limiting plates 211 are parallel to each other and are spaced apart from each other in the first direction. Each of the limiting plates 211 of the first rail structure 21 is formed with a sliding slot 212 that extends in the insertion direction (X). The guiding surface 22 has a flat surface portion 221 and an inclined surface portion 222 that are arranged in the insertion direction (X), and is formed there through with two pin extension slots 223 that extend from the flat surface portion 221 to the inclined surface portion 222 and that communicates the accommodating space 121.

The two pin extension slots 223 are parallel to each other and are spaced apart in the first direction. Each of the pin extension slots 223 extends substantially in the insertion direction (X). The flat surface portion 221 is parallel to the lateral plate 122 of the mounting frame 12. The inclined surface portion 222 extends from the flat surface portion 221 toward the opening 123 of the mounting frame 12 and is inclined outwardly from the lateral plate 122. The through hole 23 is farther from the opening 123 than the guiding surface 22. In this embodiment, the first engaging structure 24 is an engaging plate that protrudes outwardly and perpendicularly from the lateral plate 122, that is parallel to the insertion direction (X), and that has a first engaging edge 241 opposite to the opening 123 in the insertion direction (X). The configuration of the first engaging structure 24 may vary in other embodiments of this invention.

Referring to FIGS. 2 to 5, the locking unit 3 is mounted to the rail unit 2, and has a main body 31, a second rail structure 32 that is fixed on the main body 31, a first flexible portion 33 that extends from the main body 31 toward the opening 123, and a second flexible portion 34 that extends from the main body 31. The main body 31 has a main portion 311 and a deformable portion 312 that are arranged in the insertion direction (X), two fixing pins 313 that protrude from the deformable portion 312 and that extend respectively into the two pin extension slots 223, and two protruding pieces 314 that protrude from the main portion 311 and that are parallel to the limiting plates 211 of the first rail structure 21. The main portion 311 and the deformable portion 312 of the main body 31 are formed as a flat board that is parallel to the flat surface portion 221 of the guiding surface 22. The deformable portion 312 extends from the main portion 311 toward the opening 123 and abuts against the guiding surface 22. Each of the fixing pins 313 is slidable along the respective one of the pin extension slots 223. The protruding pieces 314 are parallel to and abut respectively against inner sides of the limiting plates 211 so that the locking unit 3 is not allowed to move in the first direction.

Figure 10:
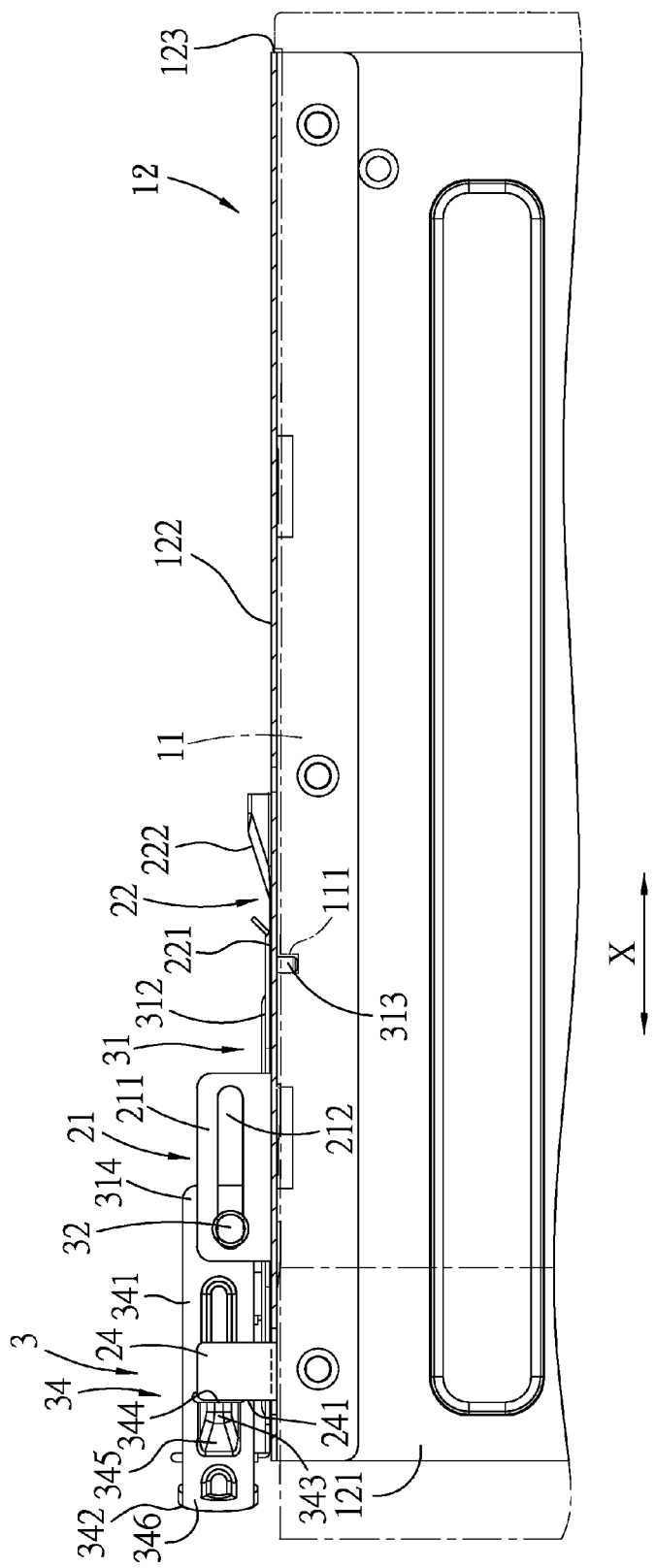

In this embodiment, the second rail structure 32 is a sliding rod that extends through the protruding pieces 314 and that has opposite end portions engaging respectively the sliding slots 212 of the limiting plates 211 and slidable in the insertion direction (X). The second rail structure 32 cooperates with the first rail structure 21 such that the locking unit 3 is slidable in the insertion direction (X) between an unlocked position (see FIGS. 6 and 7) which is proximate to the opening 123, and a locked position (see FIG. 10) which is distal from the opening 123. The first flexible portion 33 is configured as a plate that extends from the main portion 311 of the main body 31 toward the opening 123, is bent into the accommodating space 121, is elastically deformable relative to the main body 31 in a second direction perpendicular to the insertion direction (X) and the first direction, and has an abutment edge 331 that faces the opening 123 and a first slope 332 that faces away from the opening 123.

The second flexible portion 34 extends from one of the protruding pieces 314 of the main body 31 away from the opening 123, is configured as a plate that has a portion substantially parallel to the one of the protruding pieces 314, and is elastically deformable relative to the main body 31 in the first direction. Specifically, the second flexible portion 34 has an arm plate 341 that extends from the one of the protruding pieces 314 in the insertion direction (X), a press plate 342 that extends from a distal end of the arm plate 341, and a second engaging structure 343 that is formed on the arm plate 341. The second engaging structure 343 is engageable removably the first engaging structure 24 such that the locking unit 3 is not allowed to move in the insertion direction (X) toward the opening 123 when the second engaging structure 343 is engaged with the first engaging structure 24. In this embodiment, the second engaging structure 343 is a protruding block that protrudes from the arm plate 341 of the second flexible portion 34, and that has a second engaging edge 344 abutting against the first engaging edge 241 when the locking unit 3 is at the locked position, and a second slope 345 opposite to the opening 123 and abutting slidably against the first engaging structure 24 during movement of the locking unit 3 from the unlocked position to the locked position. The press plate 342 is substantially perpendicular to the arm plate 341, is slightly inclined away from the opening 123, and is formed with a press surface 346 that is opposite to the opening 123.

Figure 6:
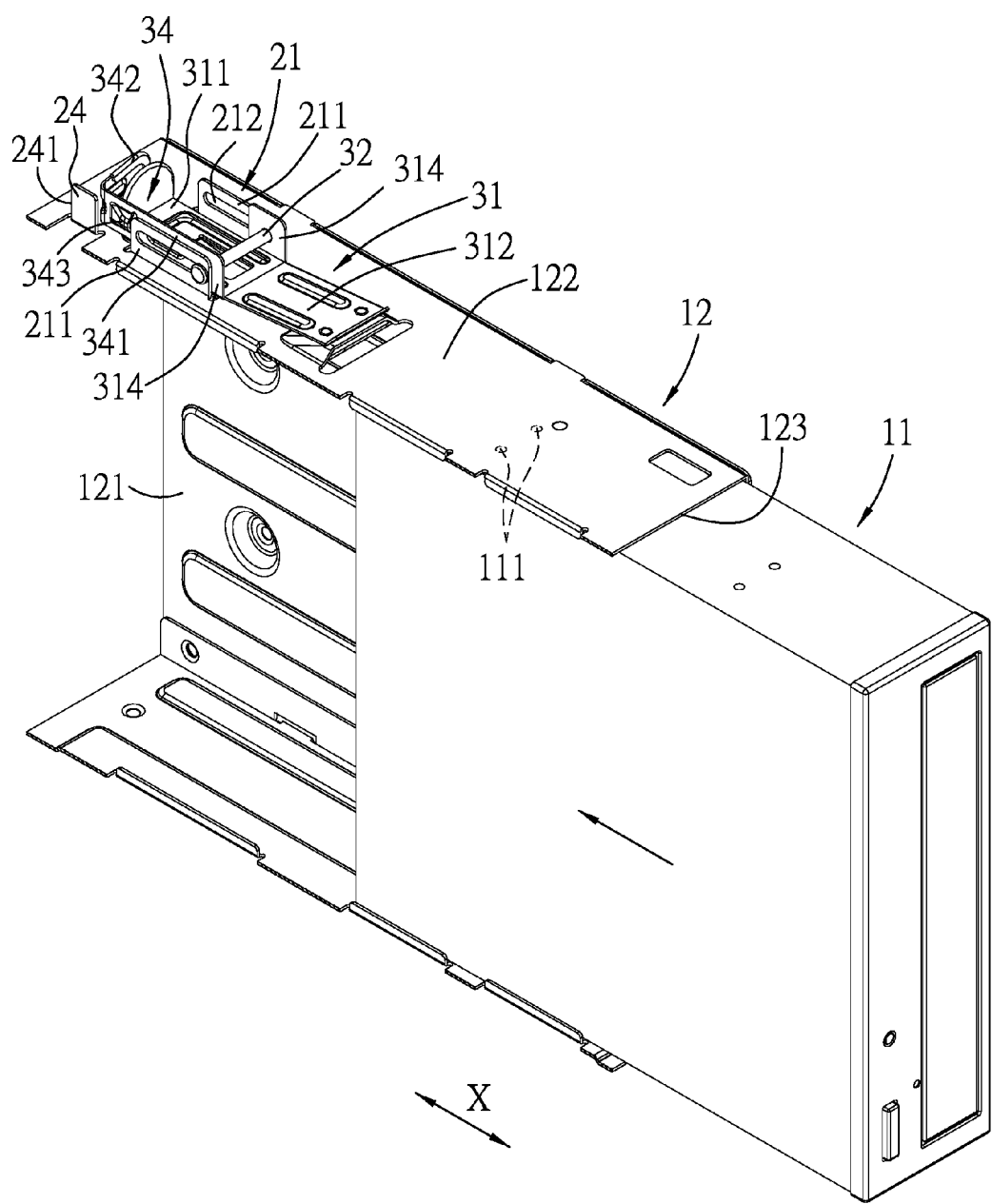
FIG. 6 is a partly sectional perspective view of the securing mechanism, the mounting frame and the electronic device, showing a locking unit of the securing mechanism at an unlocked position.
Figure 7:
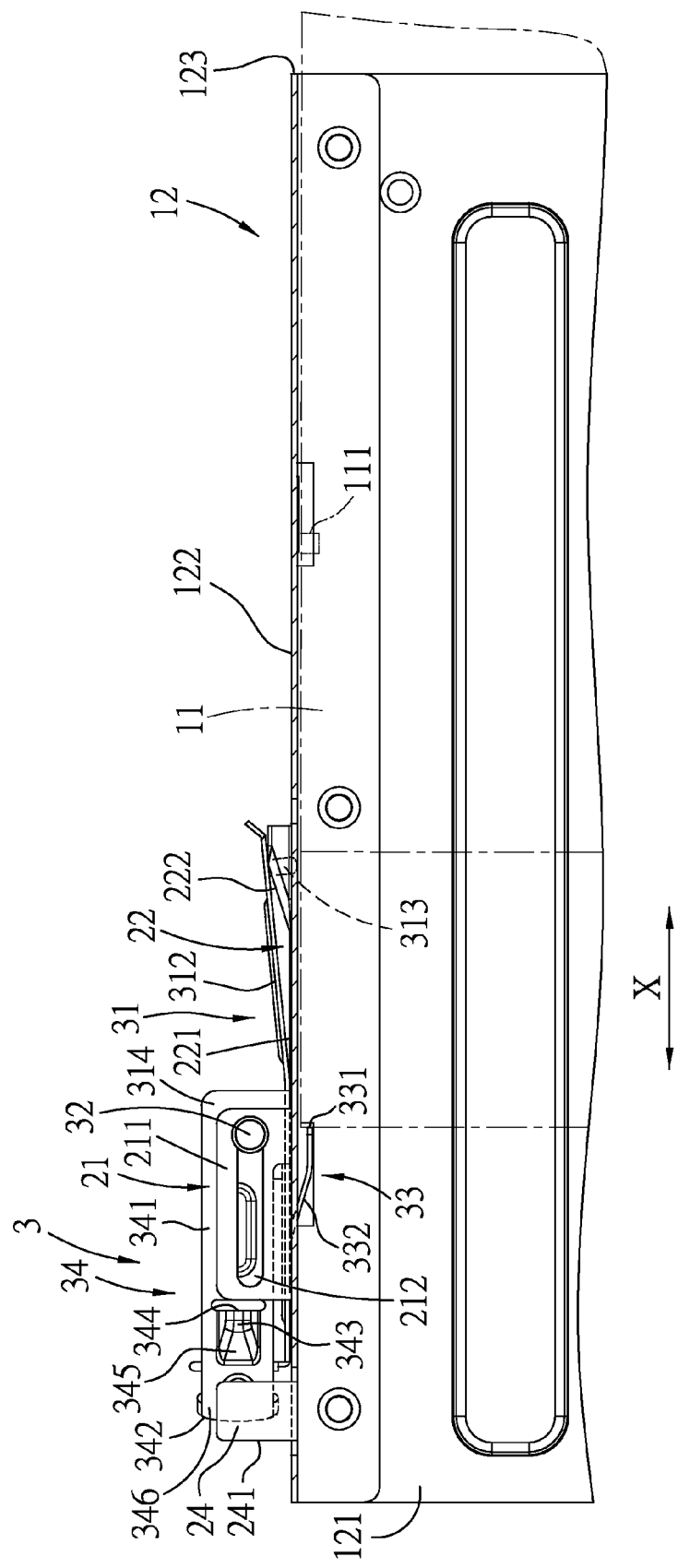
FIGS. 7 to 10 are fragmentary partly sectional views showing the mounting process of the electronic device to the mounting frame.
Figure 8:
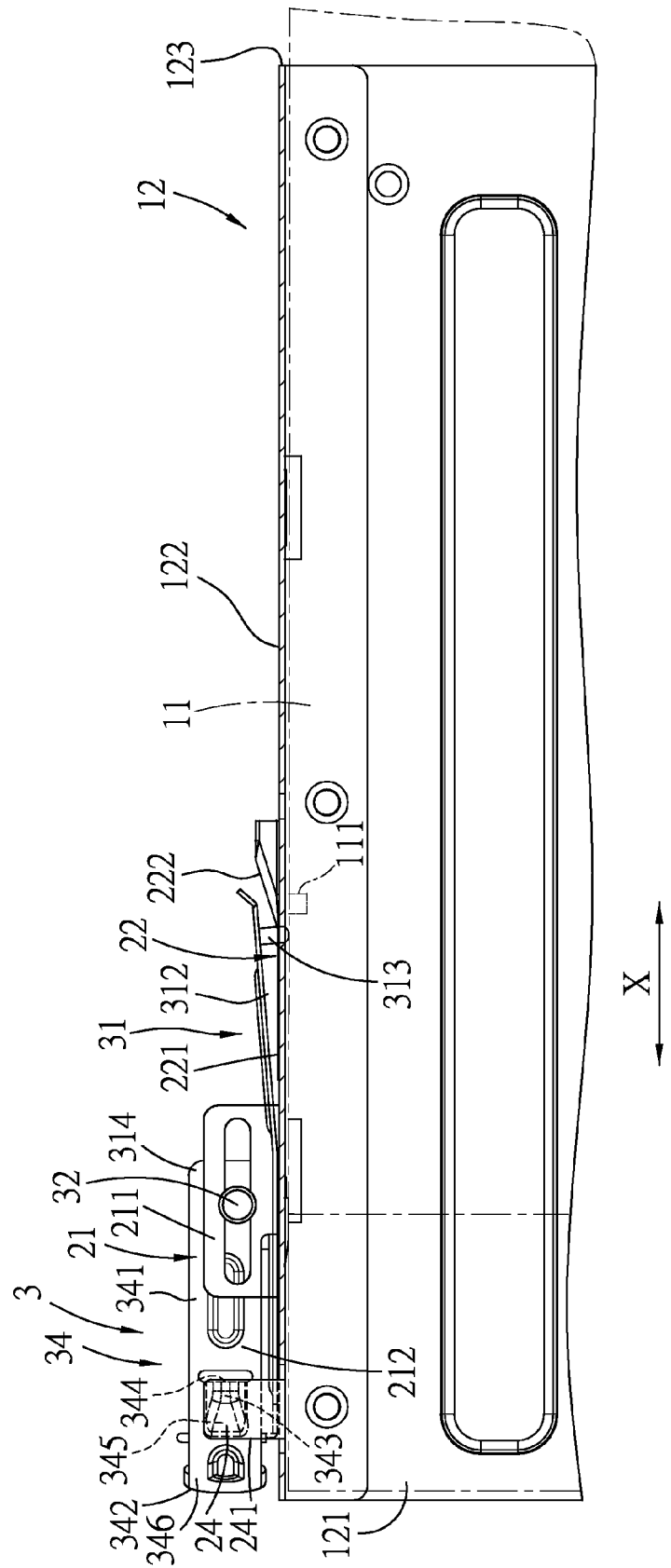
Figure 9:
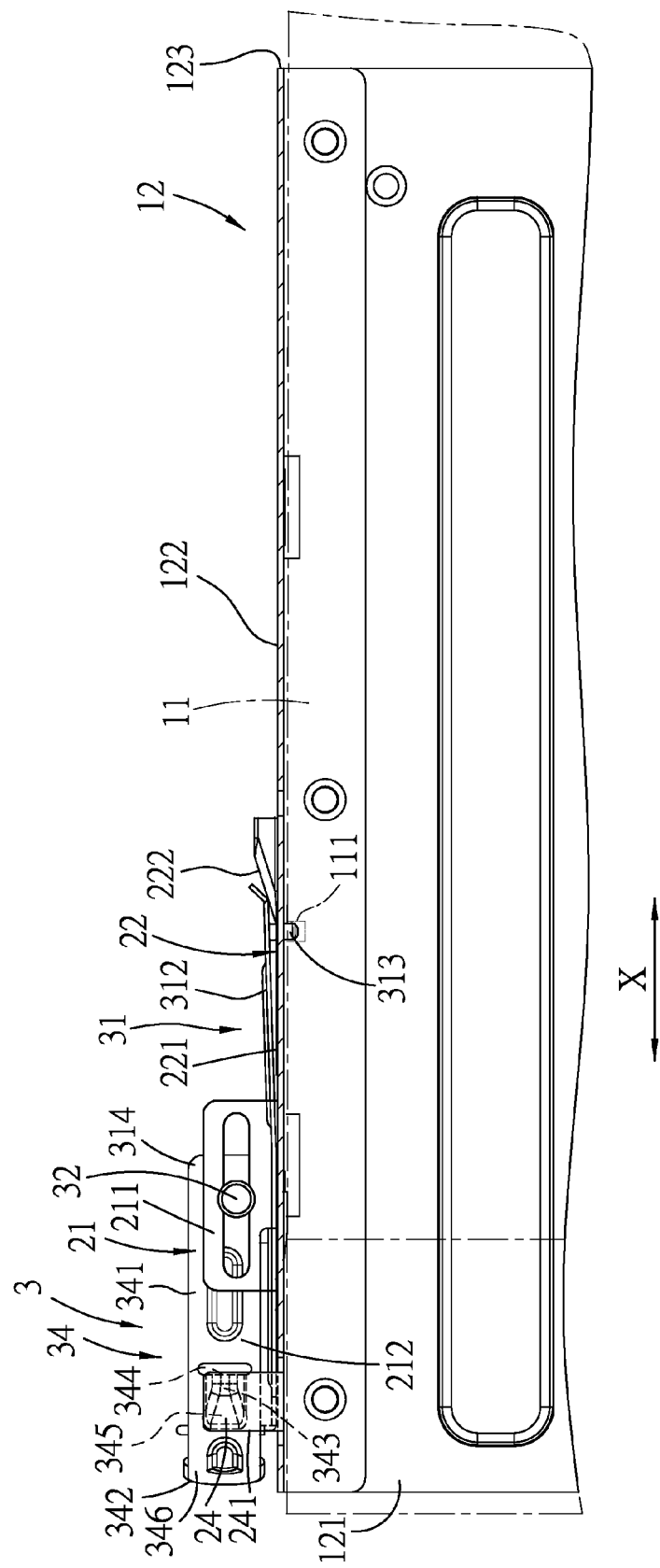

Referring to FIGS. 6 and 7, to mount the electronic device 11 to the mounting frame 12, the electronic device 11 is inserted in the insertion direction (X) into the accommodating space 121 through the opening 123. Before the electronic device 11 contacts the locking unit 3, the locking unit 3 is at the unlocked position. At this time, the first flexible portion 33 extends into the accommodating space 121 through the through hole 23 (see FIG. 3), the deformable portion 312 of the main body 31 is pushed by the inclined surface portion 222 of the guiding surface 22 to deform so that the fixing pins 313 (only one is shown in FIG. 7) are moved away from the accommodating space 121, and the first engaging structure 24 and the second engaging structure 343 are separated from each other in the insertion direction (X).

Figure 11:
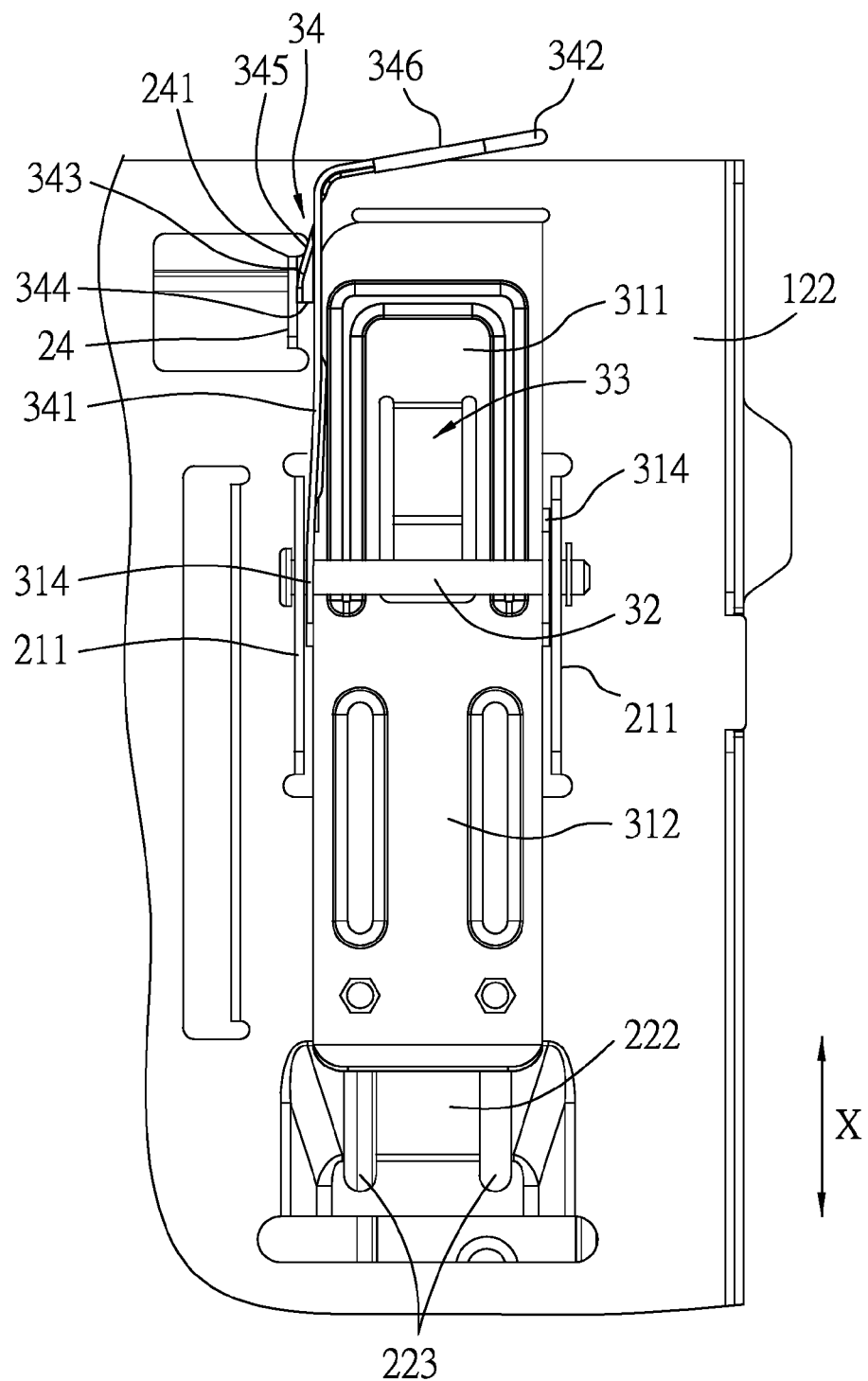
FIG. 11 is a fragmentary top view of the securing mechanism and the mounting frame, showing a second flexible portion that is pushed by a first engaging structure to deform during movement of the locking unit between the unlocked position and a locked position.

Referring to FIGS. 7 to 10, as the electronic device 11 is further inserted into the accommodating space 121 and contacts the locking unit 3, the abutment edge 331 of the first flexible portion 33 is pushed by a side of the electronic device 11 away from the opening 123 to result in movement of the locking unit 3 toward the locked position in the insertion direction (X). During the movement, the first slope 332 of the first flexible portion 33 is pushed by a hole-defining edge of the lateral plate 122 that defines the through hole 23 (see FIG. 3) such that the first flexible portion 33 deforms and leaves the accommodating space 121 through the through hole 23. Meanwhile, the deformable portion 312 of the main body 31 is gradually separated from the inclined surface portion 222, and restores to drive the fixing pins 313 (only one can be seen in each of FIGS. 7 to 10) to abut slidably against a lateral surface of the electronic device 11. Simultaneously, the second slope 345 of the second engaging structure 343 is pushed by the first engaging structure 24 (see FIG. 11) so that the arm plate 341 of the second flexible portion 34 deforms elastically.

Figure 12:
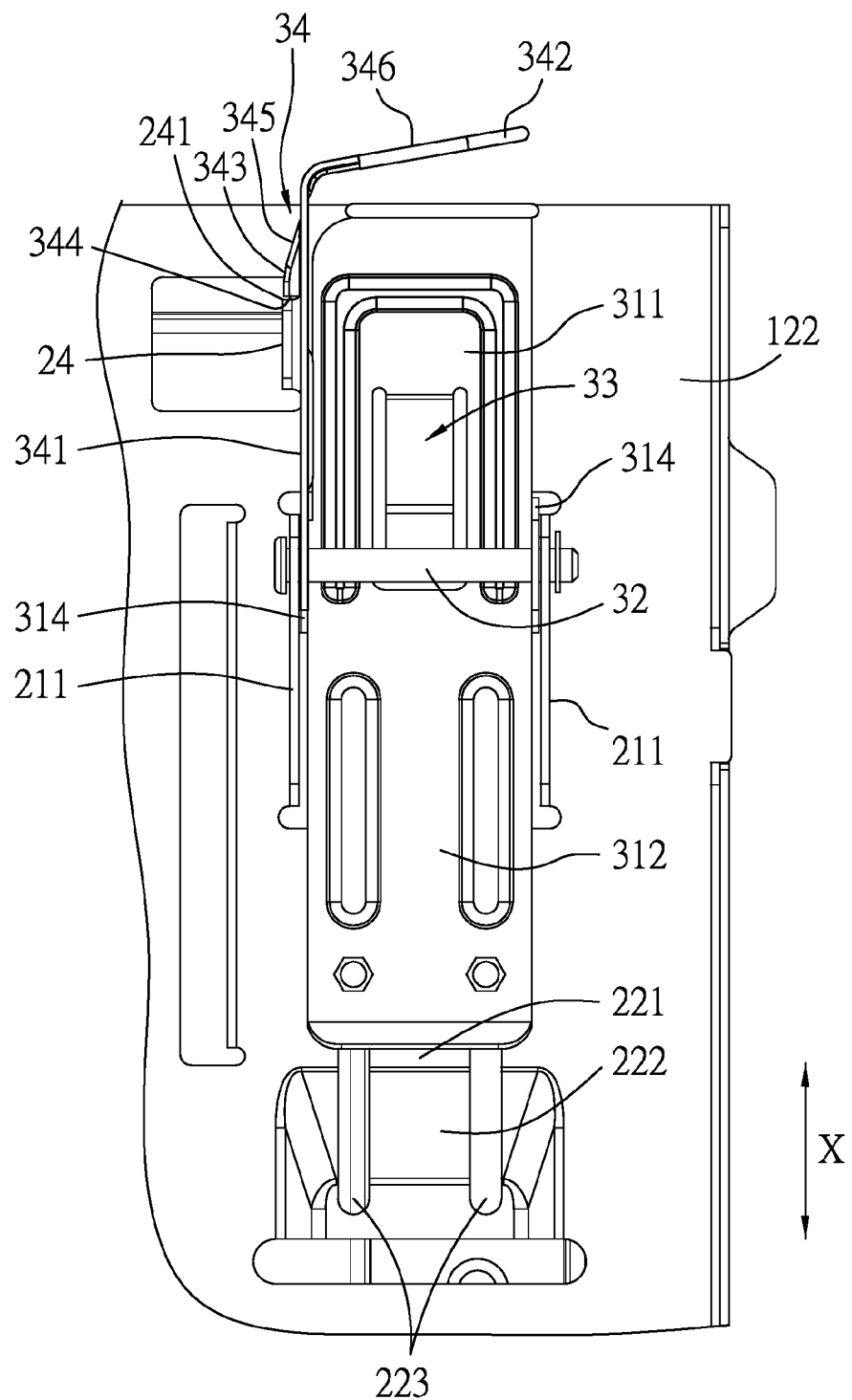
FIG. 12 is a fragmentary top view that is similar to FIG. 11, but showing a second engaging structure of the second flexible portion that engages the first engaging structure when the locking unit is at a locked position.

When the electronic device 11 continues to enter the accommodating space 121 until the locking unit 3 is at the locked position, the fixing pins 313 of the locking unit 3 engage respectively the fixing holes 111 (only one can be seen in FIG. 9) of the electronic device 11 so that the electronic device 11 is secured to the locking unit 3 through the fixing pins 313. When the locking unit 3 is at the locked position, the second slope 345 of the second engaging structure 343 is separated from and is no longer pushed by the first engaging structure 24 such that the arm plate 341 of the second flexible portion 34 restores to result in engagement between the first engaging edge 241 of the first engaging structure 24 and the second engaging edge 344 of the second engaging structure 343 (see FIG. 12). The locking unit 3 is therefore not allowed to move in the insertion direction (X) toward to the opening 123 so that the electronic device 11 is locked and is prevented from escaping from the accommodating space 121 through the opening 123.

Figure 13:
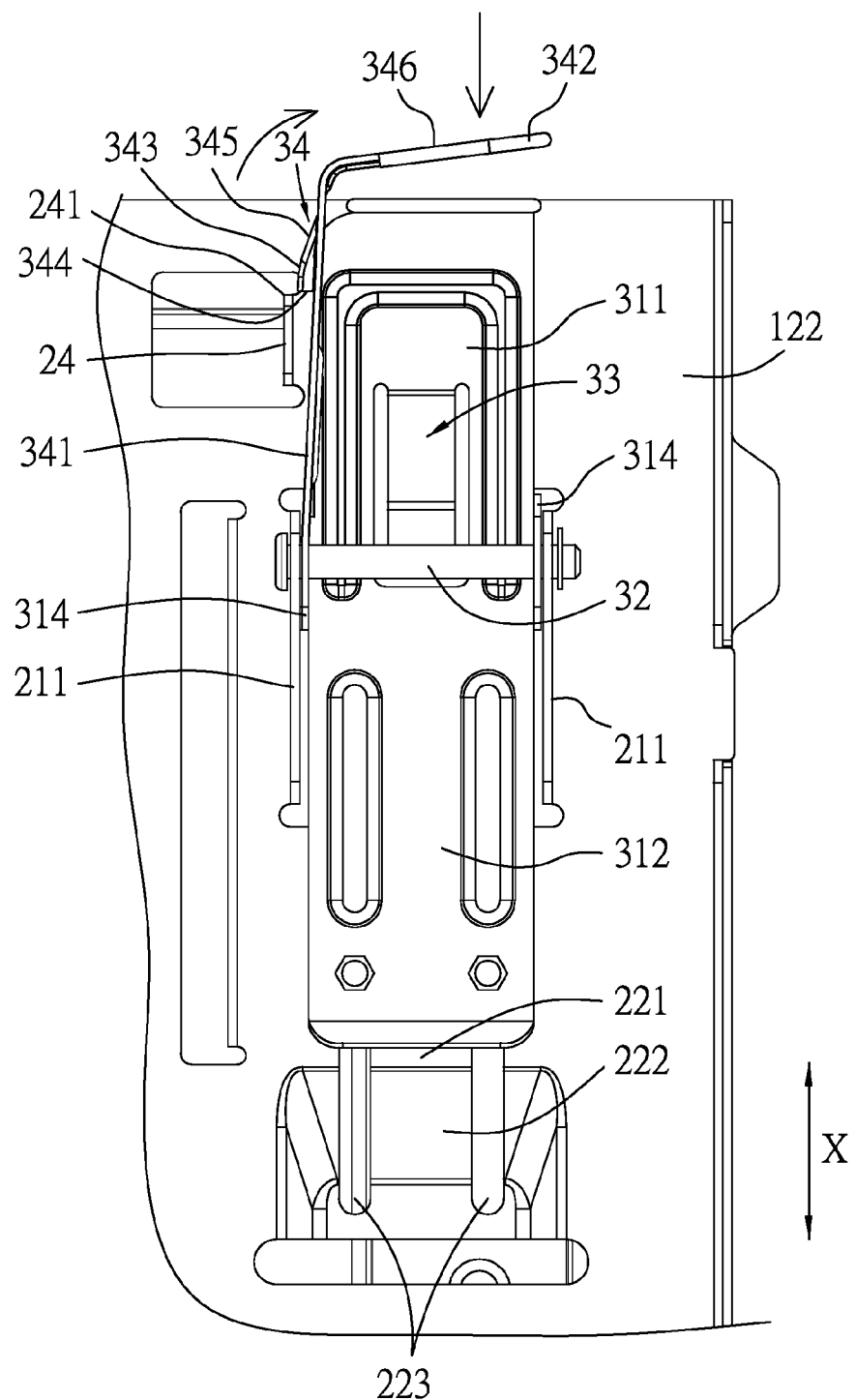
FIG. 13 is a fragmentary top view that is similar to FIG. 11, but showing a press plate that is pressed to separate the second engaging structure from the first engaging structure.

Referring to FIG. 13, when removing the electronic device 11 from the mounting frame 12, a user just has to press the press surface 346 of the press plate 342 of the second flexible portion 34 so as to deform elastically the arm plate 341 and to separate the second engaging edge 344 of the second engaging structure 343 from the first engaging edge 241 of the first engaging structure 24. The locking unit 3 can then move to the unlocked position, during which the fixing pins 313 (see FIG. 4) drive the electronic device 11 to move outwardly of the mounting frame 12 through the opening 123 in the insertion direction (X). When the locking unit 3 is back at the unlocked position, the deformable portion 312 deforms to move the fixing pins 313 away from the fixing holes 111 (see FIG. 6) of the electronic device 11 so that the electronic device 11 is no longer engaged with the locking unit 3 (see FIG. 7) and can be pulled out easily from the accommodating space 121.

Figure 14:
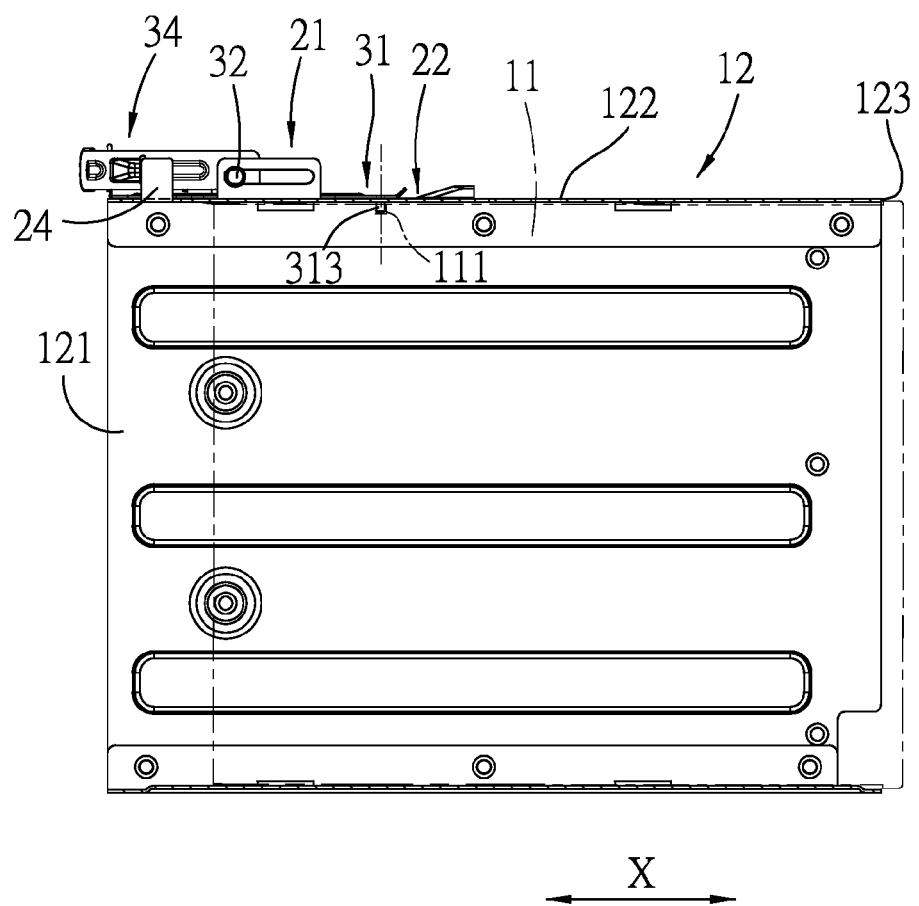
FIG. 14 is a sectional view showing the securing mechanism mounted to the mounting frame with a relatively small size.
Figure 15:
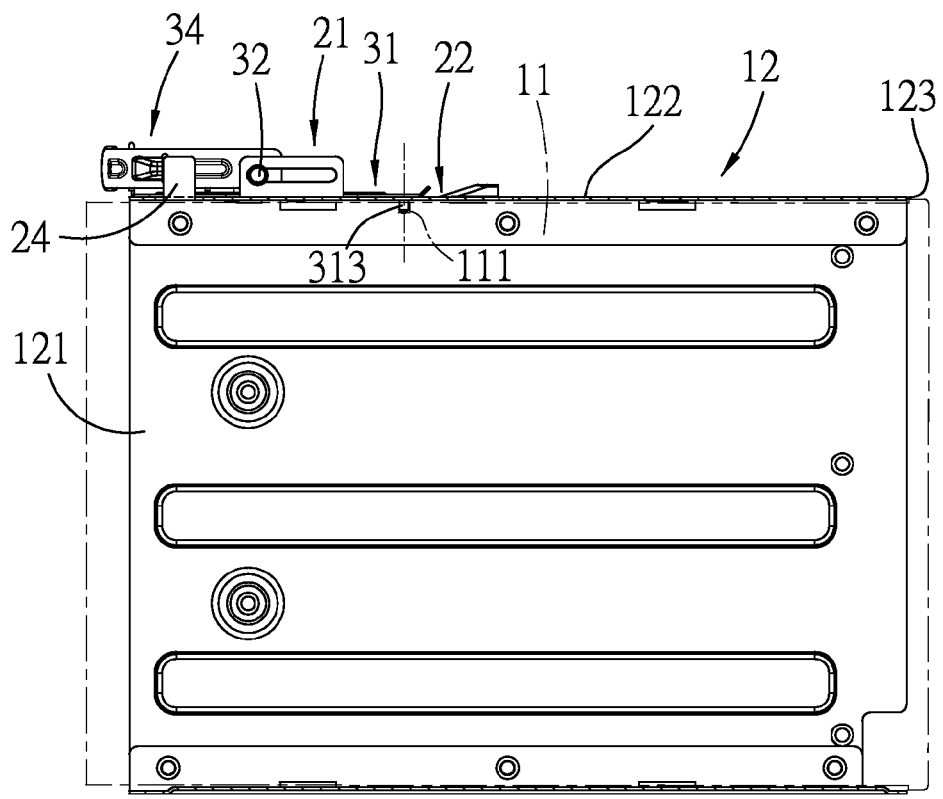
FIG. 15 is a sectional view showing the securing mechanism mounted to the mounting frame with a relatively large size.

Referring to FIGS. 14 and 15, since the securing mechanism secures the electronic device 11 via the engagement between the fixing pins 313 (only one is shown) and the fixing holes 111 (only one is shown) of the electronic device 11, the electronic devices 11 with different sizes can all be secured to the mounting frame 12 via the securing mechanism as long as each of the electronic devices 11 is formed with the fixing holes 111 that are engageable with the fixing pins 313 of the securing mechanism.

To sum up, since the locking unit 3 is slidable in the insertion direction (X) and the first flexible portion 33 extends into the accommodating space 121, when the electronic device 11 is inserted into the accommodating space 121, the first flexible portion 33 is pushed by the electronic device 11 to move the locking unit 3 to the locked position so as to secure the electronic device 11. Therefore, the mounting process of the electronic device 11 can be done by using only one hand. Moreover, when removing the electronic device 11, since the fixing pins 313 are inserted respectively into the fixing holes 111 of the electronic device 11, the locking unit 3 drives the electronic device 11 to protrude from the accommodating space 121 as the locking unit 3 moves to the unlocked position. Therefore, removing process of the electronic device 11 can also be done efficiently by using only one hand. Moreover, since the securing mechanism secures the electronic device 11 via the engagement between the fixing pins 313 and the fixing holes 111 of the electronic device 11, electronic devices 11 with different sizes can all be secured to the mounting frame 12 as long as each of the electronic devices 11 is formed with the fixing holes 111. As a result, the objects of the present invention can be accomplished.

While the present invention has been described in connection with what are considered the most practical embodiment, it is understood that this invention is not limited to the disclosed embodiment but is intended to cover various arrangements included within the spirit and scope of the broadest interpretation and equivalent arrangements.

What is claimed is:

1. A securing mechanism adapted for fixing at least one electronic device to amounting frame, the mounting frame defining an accommodating space, and having a lateral plate and an opening that communicates the accommodating space, the electronic device being able to be inserted into or pulled out from the accommodating space through the opening in an insertion direction that is parallel to the lateral plate, and being formed with at least one fixing hole that faces the lateral plate, said securing mechanism comprising:

at least one rail unit having
      a first rail structure that is adapted to be fixed on the lateral plate,
      a guiding surface that is adapted to be formed at an outer end of the lateral plate, that has a flat surface portion and an inclined surface portion arranged in the insertion direction, and that is formed with at least one pin extension slot extending substantially in the insertion direction, said flat surface portion being parallel to the lateral plate, said inclined surface portion extending from said flat surface portion toward the opening and being inclined outwardly from the lateral plate,
      a through hole that extends through the lateral plate to communicate the accommodating space, and that is farther from the opening than said guiding surface, and
      a first engaging structure that is adapted to be fixed on the lateral plate; and
   at least one locking unit mounted to said rail unit, and having
      a main body that has a main portion and a deformable portion arranged in the insertion direction, and at least one fixing pin protruding from said deformable portion into said pin extension slot, said deformable portion extending from said main portion toward the opening and abutting against said guiding surface,
      a second rail structure that is fixed on said main body and that cooperates with said first rail structure such that said locking unit is slidable in the insertion direction between an unlocked position which is proximate to the opening, and a locked position which is distal from the opening,
      a first flexible portion that extends from said main body toward the opening, that is bent into the accommodating space, that is elastically deformable relative to said main body, and that has a first slope facing away from the opening, and
      a second flexible portion that extends from said main body, that is elastically deformable relative to said main body, and that has a second engaging structure being engageable removably said first engaging structure;
   wherein, when said locking unit is at the unlocked position, said first flexible portion extends into the accommodating space through said through hole, said deformable portion deforms to move said fixing pin away from the accommodating space, and said first engaging structure and said second engaging structure are separated from each other; and
   wherein, when the electronic device is inserted into the accommodating space, said first flexible portion is pushed by the electronic device to result in movement of said locking unit to the locked position, where said first slope is pushed by the lateral plate such that said first flexible portion deforms and leaves the accommodating space, where said deformable portion of said main body is separated from said inclined surface portion and restores to drive said fixing pin to engage the fixing hole of the electronic device, and where said second engaging structure engages said first engaging structure.

2. The securing mechanism as claimed in claim 1, wherein said main portion and said deformable portion of said main body are formed as a flat board that is parallel to said flat surface portion of said guiding surface, said first flexible portion being configured as a plate, extending from said main portion of said main body toward the opening, bent into the accommodating space, and further having an abutment edge that faces the opening.

3. The securing mechanism as claimed in claim 1, wherein said first rail structure has two limiting plates that protrude outwardly from the lateral plate, said limiting plates being parallel to each other and being spaced apart from each other in a direction perpendicular to the insertion direction, said main body of said locking unit further having two protruding pieces that are parallel to and that abut respectively against inner sides of said limiting plates so that said locking unit is not allowed to move in the direction perpendicular to the insertion direction.

4. The securing mechanism as claimed in claim 3, wherein each of said limiting plates of said first rail structure is formed with a sliding slot that extends in the insertion direction, said second rail structure being a sliding rod that extends through said protruding pieces and that has opposite end portions engaging respectively said sliding slots and slidable in the insertion direction.

5. The securing mechanism as claimed in claim 3, wherein said second flexible portion extends from one of said protruding pieces away from the opening, and has at least a portion substantially parallel to the one of said protruding pieces.

6. The securing mechanism as claimed in claim 5, wherein said second flexible portion further has an arm plate that extends from the one of said protruding pieces in the insertion direction, and a press plate that extends from a distal end of said arm plate, that is substantially perpendicular to said arm plate, that is slightly inclined away from the opening, and that is formed with a press surface opposite to the opening.

7. The securing mechanism as claimed in claim 6, wherein:
   said first engaging structure is an engaging plate that protrudes outwardly from the lateral plate, that is parallel to the insertion direction, and that has a first engaging edge opposite to the opening; and
   said second engaging structure is a protruding block that protrudes from said arm plate of said second flexible portion, and that has a second engaging edge abutting against said first engaging edge when said locking unit is at the locked position, and a second slope opposite to the opening.

8. The securing mechanism as claimed in claim 1, wherein:
   said guiding surface is formed with two of said pin extension slots that are parallel to each other and that are spaced apart from each other in a direction perpendicular to the insertion direction; and said main body of said locking unit has two of said fixing pins that respectively protrude into said pin extension slots.

9. The securing mechanism as claimed in claim 1, comprising a plurality of said rail units that are parallel to each other and that are spaced apart from each other in a direction perpendicular to the insertion direction, and a plurality of said locking units that are respectively mounted to said rail units.

* * * * *